(12) United States Patent
Choi et al.

(10) Patent No.: US 6,496,399 B1
(45) Date of Patent: Dec. 17, 2002

(54) COMPACT TERNARY CONTENT ADDRESSABLE MEMORY CELL

(75) Inventors: Jeong Yeol Choi, Palo Alto, CA (US); Sang-Yun Lee, Beaverton, OR (US)

(73) Assignee: Integrated Device Technology, Inc., Santa Clara, CA (US)

(*) Notice: Subject to any disclaimer, the term of this patent is extended or adjusted under 35 U.S.C. 154(b) by 0 days.

(21) Appl. No.: 09/941,372

(22) Filed: Aug. 28, 2001

(51) Int. Cl.$^7$ .............................................. G11C 15/00
(52) U.S. Cl. ..................... 365/49; 365/168; 365/189.07
(58) Field of Search ....................... 365/49, 168, 203, 365/189.07, 204, 205

(56) References Cited

U.S. PATENT DOCUMENTS

| | | |
|---|---|---|
| 5,258,946 A | 11/1993 | Graf |
| 5,469,378 A | 11/1995 | Albon et al. |
| 6,044,005 A | 3/2000 | Gibson et al. |
| 6,101,115 A | 8/2000 | Ross |
| 6,154,384 A | 11/2000 | Nataraj et al. |
| 6,157,558 A | 12/2000 | Wong |
| 6,195,278 B1 | 2/2001 | Calin et al. |
| 6,262,907 B1 * | 7/2001 | Lien et al. ............. 365/189.07 |

OTHER PUBLICATIONS

"A Ternary Content Addressable Search Engine" by Jon P. Wade and Charles G. Sodini, IEEE Jounral of Solida–State Circuits, vol. 24, No. 4, Aug. 1989, pp. 1003–1013.

* cited by examiner

*Primary Examiner*—David Lam
(74) *Attorney, Agent, or Firm*—Bever, Hoffman & Harms LLP

(57) ABSTRACT

A ternary CAM system includes a main memory cell configured to store complementary data signals D/D#. A first transistor has a source coupled to receive data signal D#, and a gate coupled to receive a compare signal C. A second transistor has a source coupled to receive data signal D, and a gate coupled to receive complementary compare signal C#. A third transistor has a gate coupled to drain regions of the first and second transistors. A mask cell storing a mask value is coupled to the source of the third transistor. A pre-charged match line is coupled to the drain of the third transistor. If compare signals C/C# match data signals D/D#, then the third transistor is turned off, thereby isolating match line and mask cell. If compare signals C/C# don't match data signals D/D#, then the third transistor is turned on, thereby coupling mask cell and match line.

25 Claims, 8 Drawing Sheets

COMPACT TERNARY CONTENT ADDRESSABLE MEMORY CELL

FIELD OF THE INVENTION

The present invention relates to ternary content addressable memory (CAM) cells. More specifically, the present invention relates to ternary CAM cells having improved compare and mask circuits.

DESCRIPTION OF RELATED ART

FIG. 1 is a circuit diagram of a conventional ternary CAM cell system 100, which includes main memory cell 101, compare circuit 102, mask circuit 103, pre-charge circuit 104, mask memory cell 105 and match line 106. Compare circuit 102 includes n-channel transistors 111–113, and mask circuit 103 includes n-channel transistor 114. A data value comprised of complementary data signals D and D# is written to main memory cell 101 on complementary bit lines BL and BL#, respectively. Once written, main memory cell 101 provides complementary data signals D# and D to the gates of transistors 111 and 112, respectively. A mask value (M) is written to mask memory cell 105. The mask value is applied to the gate of n-channel transistor 114 of mask circuit 103.

A compare operation is performed in ternary CAM cell system 100 as follows. Pre-charge circuit 104 applies a positive voltage to match line 106, thereby charging match line 106 to a logic high state. Pre-charge circuit 104 then allows match line 106 to float. A sense amplifier (not shown) senses the state of match line 106. A compare value comprised of complementary data signals C and C# is applied to complementary compare lines CMP and CMP#, respectively, and thereby to the sources of transistors 111 and 112, respectively. If the compare value matches the data value previously written to main memory cell 101, then a logic low signal is applied to the gate of transistor 113. In this case, transistor 113 is turned off, and match line 106 remains at a logic high state, thereby indicating a match condition.

However, if the compare value does not match the data value previously written to main memory cell 101, then a logic high signal is applied to the gate of transistor 113. In this case, transistor 113 is turned on. If transistor 114 is also turned on (i.e., the mask value M is programmed to a logic high value), then match line 106 is pulled down to a logic low state (i.e., ground), thereby indicating a no-match condition.

If the mask value M has a logic low value, then transistor 114 is turned off, and match line 106 will not be pulled down by ternary CAM system 100 regardless of the presence of a match or no-match condition.

Ternary CAM system 100 has the following shortcomings. First, ternary CAM system 100 requires two separate functional blocks to implement the compare and mask functions (i.e., compare circuit 102 and mask circuit 103). As a result, a relatively large number of transistors are required to implement ternary CAM system 100. Second, match line 106 is limited to a logic high pre-charge state.

FIG. 2 is a circuit diagram of another conventional ternary CAM system 200, which includes main memory cell 201, compare circuit 202, mask circuit 203, pre-charge circuit 204, mask memory cell 205 and match line 206. Compare circuit 202 includes n-channel transistors 211–212, and mask circuit 203 includes n-channel transistor 214. A data value comprised of complementary data signals D and D# is written to main memory cell 201 on complementary bit lines BL and BL#, respectively. Once written, main memory cell 201 provides complementary data signals D and D# to the sources of transistors 211 and 212, respectively. A mask value (M) is written to mask memory cell 205. The mask value is applied to the gate of n-channel transistor 214 of mask circuit 203.

A compare operation is performed in ternary CAM cell system 200 as follows. Pre-charge circuit 204 applies a positive voltage to match line 206, thereby charging match line 206 to a logic high state. Pre-charge circuit 204 then allows match line 206 to float. A sense amplifier (not shown) senses the state of match line 206. A compare value comprised of complementary data signals C and C# is applied to complementary compare lines CMP and CMP#, respectively, and thereby to the gates of transistors 211 and 212, respectively. If the compare value matches the data value previously written to main memory cell 201, then a logic high signal is applied to the source of transistor 214. If transistor 214 is turned on (i.e., the mask value M is programmed to a logic high value), a logic high signal is applied to match line 206, thereby indicating a match condition.

However, if the compare value does not match the data value previously written to main memory cell 201, then a logic low signal is applied to the source of transistor 214. If transistor 214 is turned on (i.e., the mask value M is programmed to a logic high value), a logic low signal is applied to match line 206, thereby indicating a no-match condition.

If the mask value M has a logic low value, then transistor 214 is turned off, and match line 206 will not be pulled down by ternary CAM-system 200 regardless of the presence of a match or no-match condition.

Ternary CAM system 200 has the following shortcomings. First, ternary CAM system 200 requires two separate functional blocks to implement the compare and mask functions (i.e., compare circuit 202 and mask circuit 203). Second, during a compare operation, the data value stored in main memory cell 201 can be disturbed by the current flow through compare circuit 202 and mask circuit 203.

It would therefore be desirable to have an improved ternary CAM system that overcomes the deficiencies of conventional ternary CAM systems.

SUMMARY

Accordingly, the present invention provides a ternary CAM system that includes a main memory cell, a compare/mask circuit, a mask memory cell, a match line, a pre-charge circuit and a sense amplifier. The pre-charge circuit and the sense amplifier are coupled to the match line. The pre-charge circuit is programmable to pre-charge the match line to either a logic high state or a logic low state, depending on the configuration of the ternary CAM system. The main memory cell stores a data value represented by complementary data signals D and D#. The data signal D# is applied to the source of a first transistor of the compare/mask circuit, and the data signal D is applied to the source of a second transistor of the compare/mask circuit. The gate of the first transistor is coupled to receive a compare data signal C, and the gate of the second transistor is coupled to receive a compare data signal C#, wherein the compare data signals C and C# are complementary signals representing a compare value. The drains of the first and second transistors are coupled to the gate of a third transistor of the compare/mask circuit. The source of the third transistor is coupled to receive a mask value stored in the mask memory cell, and the drain of the third transistor is coupled to the pre-charged match line.

The compare data signals C and C# turn on one and only one of the first and second transistors. If the compare data value matches the data value, then the turned on one of the first and second transistors passes a signal having a first state to the gate of the third transistor, thereby turning off the third transistor. Thus, if the compare data value matches the data value, the match line remains isolated from mask memory cell. The pre-charged match line thereby remains in a pre-charged state.

If the compare data value does not match the data value, then the turned on one of the first and second transistors passes a signal having a second state to the gate of the third transistor, thereby turning on the third transistor. Thus, if the compare data value does not match the data value, the match line is coupled to the mask memory cell through the third transistor. The mask value stored in the mask memory cell may have a state that matches the pre-charged state of the match line, such that the mask memory cell implements a mask function. Alternately, the mask value may have a state that does not match the pre-charged state of the match line, such that the mask memory cell will change the state of the pre-charged match line when the compare data value does not match the data value.

In another embodiment, the compare/mask circuit is configured in a slightly different manner. In this embodiment, the data signal D# is applied to the gate of a first transistor of the compare/mask circuit, and the data signal D is applied to the gate of a second transistor of the compare/mask circuit. The source of the first transistor is coupled to receive a compare data signal C, and the source of the second transistor is coupled to receive a compare data signal C#, wherein the compare data signals C and C# are complementary signals representing a compare value. The drains of the first and second transistors are coupled to the gate of a third transistor of the compare/mask circuit. The source of the third transistor is coupled to receive a mask value stored in the mask memory cell, and the drain of the third transistor is coupled to the pre-charged match line.

The data signals D and D# turn on one and only one of the first and second transistors. If the compare data value matches the data value, then the turned on one of the first and second transistors passes a signal having a first state to the gate of the third transistor, thereby turning off the third transistor. Thus, if the compare data value matches the data value, the match line remains isolated from mask memory cell. The pre-charged match line thereby remains in a pre-charged state.

If the compare data value does not match the data value, then the turned on one of the first and second transistors passes a signal having a second state to the gate of the third transistor, thereby turning on the third transistor. Thus, if the compare data value does not match the data value, the match line is coupled to the mask memory cell through the third transistor. The mask value stored in the mask memory cell may have a state that matches the pre-charged state of the match line, such that the mask memory cell implements a mask function. Alternately, the mask value may have a state that does not match the pre-charged state of the match line, such that the mask memory cell will change the state of the pre-charged match line when the compare data value does not match the data value.

Advantageously, the compare/mask circuit only requires three transistors. Moreover, the compare/mask circuit does not draw a current that may disturb the data value stored in the main memory cell during a compare operation. In addition, the match line can be pre-charged to either a low state or a high state by controlling the pre-charge circuit, and programming the mask memory cell with the appropriate mask value.

In one embodiment, the data value is provided to the main memory cell on a first pair of bit lines, and the compare data value is provided to the compare/mask circuit on a second pair of bit lines. In one variation, the first and second pair of bit lines can be consolidated into a single pair of bit lines.

The present invention will be more fully understood in view of the following drawings and description.

DETAILED DESCRIPTION

Figure 1:
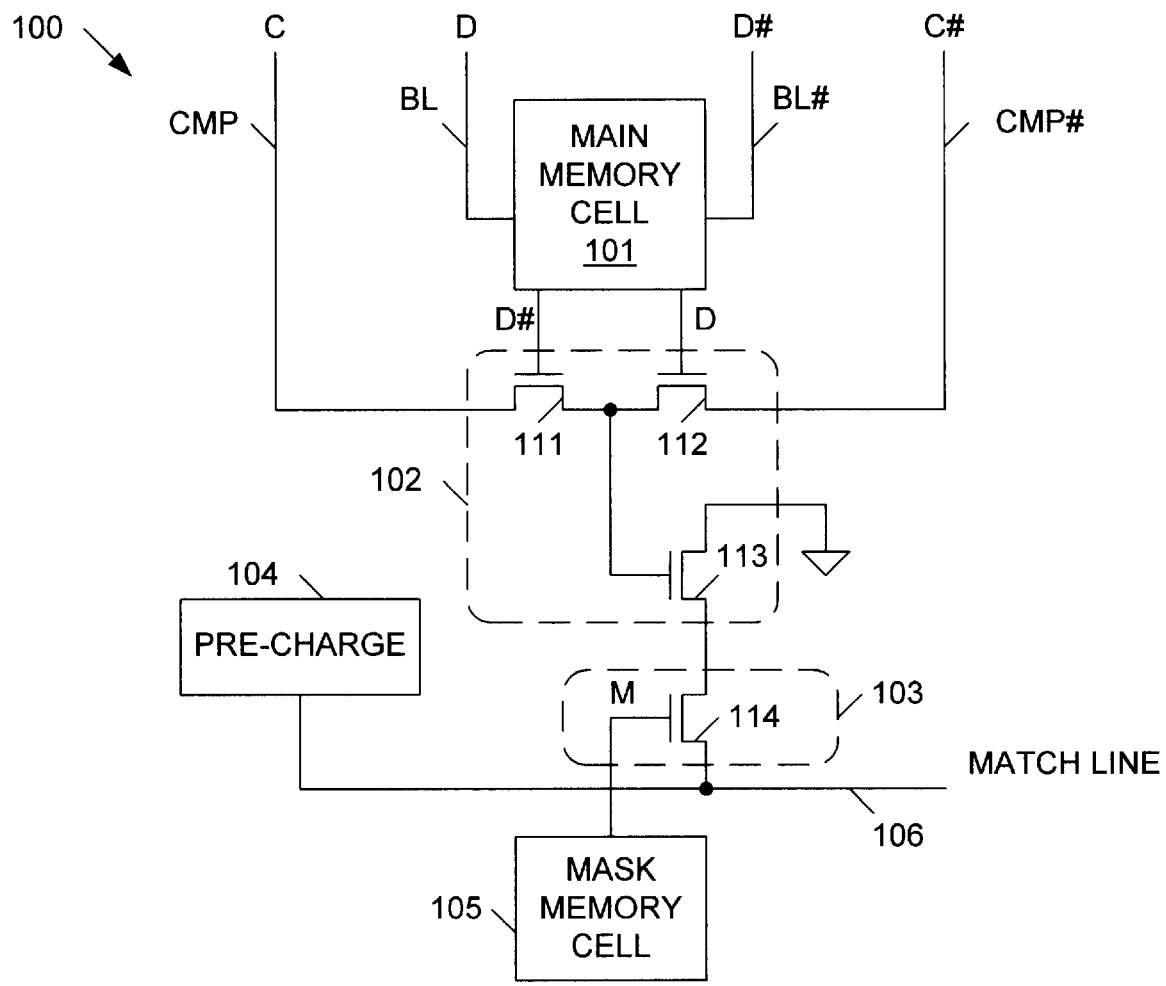
FIGS. 1 and 2 are circuit diagrams of conventional ternary CAM systems.
Figure 2:
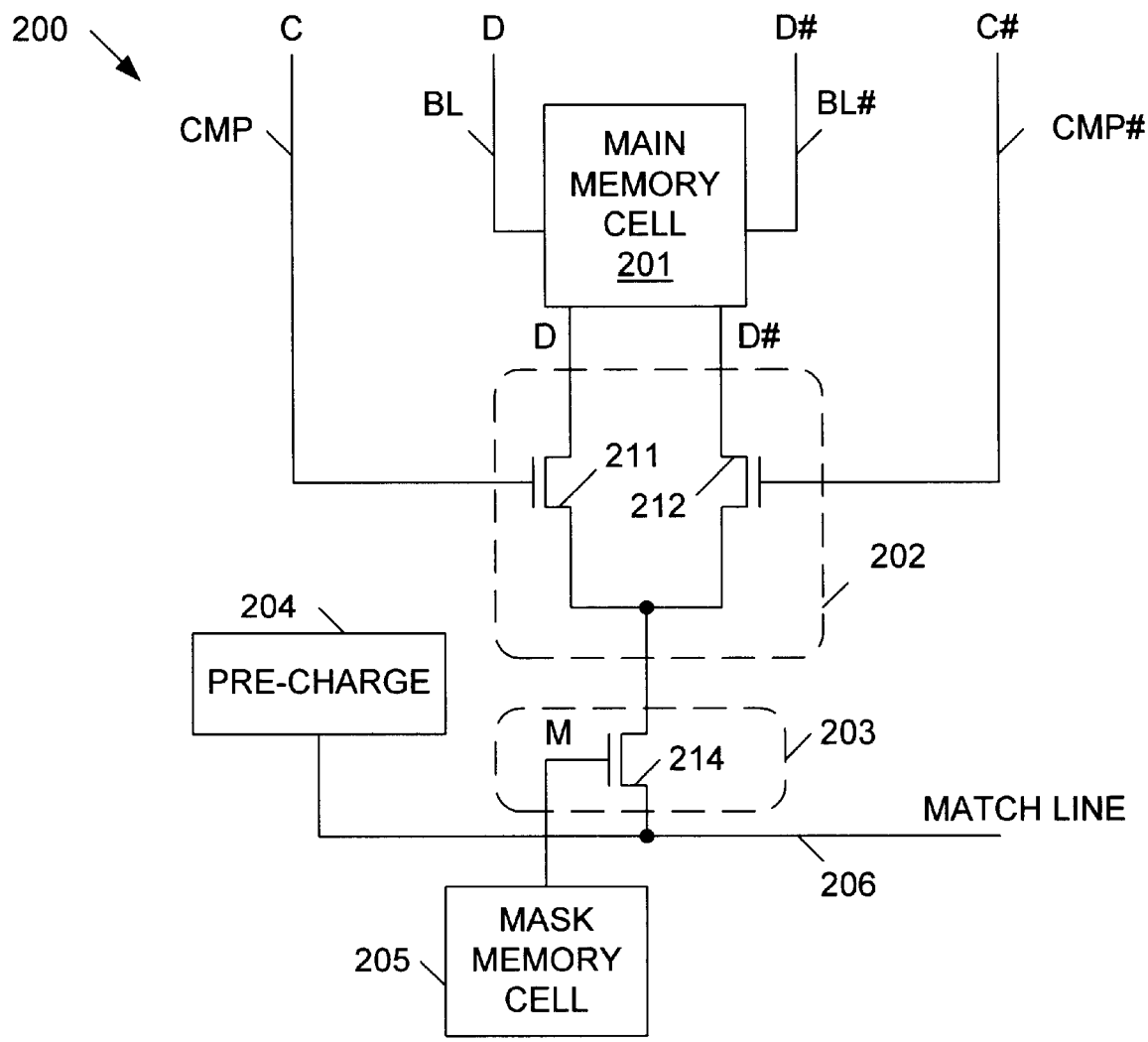
Figure 3:
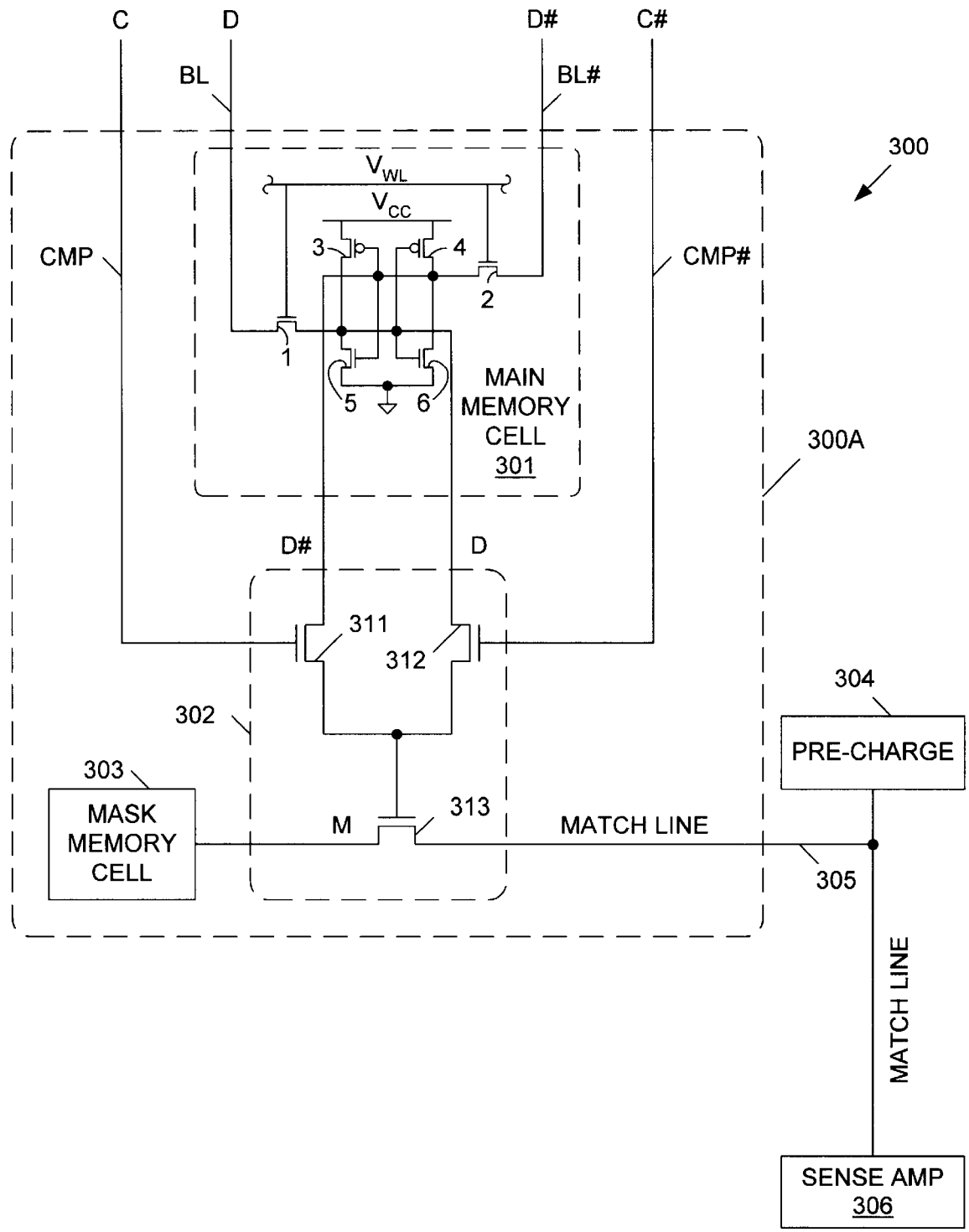
FIGS. 3 is a circuit diagram of a ternary CAM system in accordance with one embodiment of the present invention.

FIG. 3 is a circuit diagram of a ternary CAM system 300 in accordance with one embodiment of the present invention. Ternary CAM system 300 includes ternary CAM cell 300A, pre-charge circuit 304, match line 305 and sense amplifier 306. Ternary CAM cell 300A, in turn, includes main memory cell 301, compare/mask circuit 302, and mask memory cell 303.

In the described embodiment, main memory cell 301 is a static random access memory (SRAM) cell, although this is not necessary. Main memory cell 301 includes n-channel access transistors 1–2, p-channel pull-up transistors 3–4 and n-channel pull-down transistors 5–6. The operation and control of main memory cell 301 is well known to those of ordinary skill in the art. Mask memory cell 303 is also an SRAM cell in the described embodiment, although this is not necessary.

In general, a data value comprised of complementary data signals D and D# is written to main memory cell 301 on complementary bit lines BL and BL#, respectively. Once written, main memory cell 301 provides the complementary data signals D and D# to compare/mask circuit 302.

Compare/mask circuit 302 includes n-channel transistors 311–313, which are connected as illustrated. The complementary data signals D# and D stored in main memory cell 301 are applied to the sources of transistors 311 and 312, respectively, of compare/mask circuit 302. The gates of transistors 311 and 312 are coupled to receive complementary compare data values C and C#, respectively, on complementary compare lines CMP and CMP#, respectively. The drains of transistors 311 and 312 are coupled to the gate of transistor 313. The source of transistor 313 is coupled to receive a mask value (M) from mask memory cell 303. The drain of transistor 313 is coupled to match line 305.

As described in more detail below, compare/mask circuit 302 performs the functions of both a "compare circuit" and a "mask circuit". To accomplish this, transistor 313 simultaneously performs a dual role of comparing and masking. As a result, the number of transistors required to implement a mask circuit can be reduced by one or more. Consequently, ternary CAM system 300 can be implemented using a more compact design than the prior art. Also, as described in more detail below, a compare operation in ternary CAM system 300 advantageously does not result in a disturb condition for the data stored in main memory cell 301. In addition, ternary CAM system 300 allows for two different pre-charge states (high or low) on match line 305, thereby providing flexibility to circuit designers.

Pre-charge circuit 304 is programmable to pre-charge match line 305 to either a logic high voltage or a logic low voltage. Mask memory cell 303 is programmable to store either a logic high mask value or a logic low mask value. The mask value M programmed into mask memory cell 303 is selected in view of the configuration of pre-charge circuit 304. More specifically, if pre-charge circuit 304 is configured to pre-charge match line 305 to a logic high voltage, then mask memory cell 303 is programmed to store a logic high mask value M in order to activate the mask function, or to store a logic low mask value M in order to de-activate the mask function. Conversely, if pre-charge circuit 304 is configured to pre-charge match line 305 to a logic low voltage, then mask memory cell 303 is programmed to store a logic low mask value M in order to activate the mask function, or to store a logic high mask value M in order to de-activate the mask function. The reasons for programming mask memory cell 303 in this manner will become apparent in view of the subsequent disclosure.

In a first example, a compare operation is performed in ternary CAM cell system 300 as follows. Pre-charge circuit 304 pre-charges match line 305 to the predetermined voltage level. In the present example, it is assumed that pre-charge circuit 304 is configured to apply a positive voltage to match line 305, thereby charging match line 305 to a logic high state. Pre-charge circuit 304 then allows match line 305 to float.

In the present example, mask memory cell 303 is programmed to store a logic low mask value M, such that the masking function is de-activated. A compare value comprised of complementary compare data signals C and C# is applied to complementary compare lines CMP and CMP#, respectively, and thereby to the gates of transistors 311 and 312, respectively. One of the complementary compare data signals C and C# has a logic high value, which turns on the corresponding one of transistors 311 and 312.

If the compare value matches the data value previously written to main memory cell 301, then the turned on one of transistors 311–312 passes a logic low value to the gate of transistor 313. For example, if the data value D/D# is equal to "1"/"0", and the compare value C/C# is also equal to "1"/"0", then the logic "1" C signal turns on transistor 311, thereby passing the logic "0" D# signal to the gate of transistor 313. Conversely, if the data value D/D# is equal to "0"/"1", and the compare value C/C# is also equal to "0"/"1", then the logic "1" C# signal turns on transistor 312, thereby passing the logic "0" D signal to the gate of transistor 313. In either case, the logic low signal applied to the gate of transistor 313 causes this transistor 313 to turn off, thereby isolating mask memory cell 303 from match line 305. Under these conditions, match line 305 remains charged to a logic high state. Sense amplifier 306, which is coupled to match line 305, detects the high state of match line 305 and in response, identifies the presence of a match condition. In one embodiment, sense amplifier 306 is described in "Advanced MOS Devices" by D. K. Schroder, pp. 186–189, Addison-Wesley Publishing, Inc, 1987, which is hereby incorporated by reference. In other embodiments, other sense amplifiers may be used.

If the compare value does not match the data value previously written to main memory cell 301, then the turned on one of transistors 311–312 passes a logic high value to the gate of transistor 313. For example, if the data value D/D# is equal to "0"/"1", and the compare value C/C# is equal to "1"/"0", then the logic "1" C signal turns on transistor 311, thereby passing the logic "1" D# signal to the gate of transistor 313. Conversely, if the data value D/D# is equal to "1"/"0", and the compare value C/C# is equal to "0"/"1", then the logic "1" C# signal turns on transistor 312, thereby passing the logic "1" D signal to the gate of transistor 313. In either case, the logic high voltage applied to the gate of transistor 313 causes this transistor 313 to turn on, thereby coupling mask memory cell 303 to match line 305. At this time, the logic low mask value M is applied to match line 305, thereby pulling down the voltage on match line 305 to a logic low value. Sense amplifier 306 detects the low state of match line 305 and in response, identifies the presence of a no-match condition. Note that the current flowing through transistor 313 does not flow through main memory cell 301, such that the programmed state of main memory cell 301 is not disturbed.

In the present example, if mask memory cell 303 is programmed such that the mask value M has a logic high value, then the masking function is activated. Under these conditions, it does not matter whether the compare data value matches the previously stored data value, the match line 305 will remain at a logic high state during a compare operation. Thus, if the compare data value matches the previously stored data value, then transistor 313 remains off, thereby isolating match line 305 from mask memory cell 303, such that match line 305 remains charged high. Similarly, if the compare data value does not match the previously stored data value, then transistor 313 turns on, thereby coupling match line 305 to the logic high mask value M stored in mask memory cell 303, such that match line 305 remains charged high.

Alternately, ternary CAM system 300 can be configured in the following manner to perform a compare operation in accordance with a second example. Pre-charge circuit 304 is configured to pre-charge match line 305 to a logic low level (e.g., ground). Pre-charge circuit 304 then allows match line 305 to float.

In the present example, mask memory cell 303 is programmed to store a logic high mask value M, such that the masking function is de-activated. A compare value comprised of complementary compare data signals C and C# is applied to complementary compare lines CMP and CMP#, respectively, and thereby to the gates of transistors 311 and 312, respectively. One of the complementary compare data signals C and C# has a logic high value, which turns on the corresponding one of transistors 311–312.

If the compare value matches the data value previously written to main memory cell 301, then the turned on one of transistors 311–312 passes a logic low value to the gate of transistor 313. As a result, transistor 313 is turned off, thereby isolating mask memory cell 303 from match line 305. Under these conditions, match line 305 remains at a logic low state.

If the compare value does not match the data value previously written to main memory cell 301, then the turned on one of transistors 311 or 312 passes a logic high value to the gate of transistor 313. As a result, transistor 313 turns on, thereby coupling mask memory cell 303 to match line 305. At this time, the logic high mask value M is applied to match line 305, thereby pulling up the voltage on match line 305 to a logic high value. Sense amplifier 306, which is coupled to match line 305, detects the high state of the match line 305, and in response, identifies the presence of a no-match condition.

If mask memory cell 303 is programmed to store a logic low mask value M, then the masking function is activated. Under these conditions, it does not matter whether the compare data value matches the previously stored data value, the match line 305 will remain at a logic low state during a compare operation. Thus, if the compare data value matches the data value previously stored in main memory cell 301, then transistor 313 remains off, thereby isolating match line 305 from mask memory cell 303, such that match line 305 remains at a logic low state. If the compare data value does not match the data value previously stored in main memory cell 301, then transistor 313 turns on, thereby coupling match line 305 to receive the logic low mask value M stored in mask memory cell 303, such that match line 305 remains charged low.

Table 1 below summarizes the possible compare operations in ternary CAM system 300.

TABLE 1

| Pre-charge Level | Mask Value | D/D# = C/C# | Match Line |
|---|---|---|---|
| High | Low | Yes | High |
| High | Low | No | Low |
| High | High | Yes | High |
| High | High | No | High |
| Low | High | Yes | Low |
| Low | High | No | High |
| Low | Low | Yes | Low |
| Low | Low | No | Low |

Figure 4:
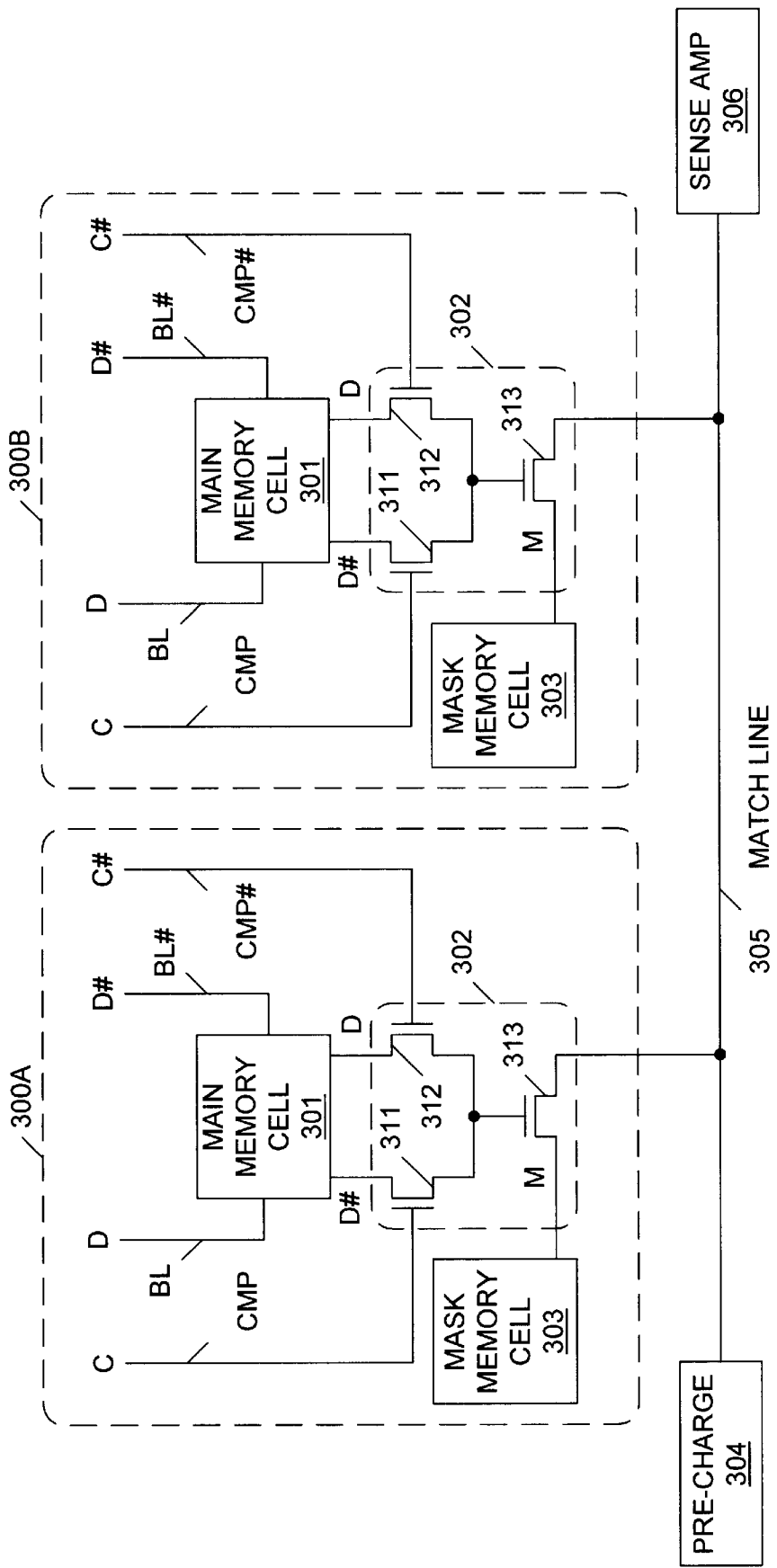
FIGS. 4 and 5 are circuit diagrams of ternary CAM system configurations in accordance with various embodiments of the present invention.

Additional ternary CAM cells, identical to ternary CAM cell 300A, can be coupled to match line 305, thereby forming a row of a ternary CAM array. FIG. 4 is a circuit diagram of a ternary CAM system 400, wherein a second ternary CAM cell 300B (which is identical to ternary CAM cell 300A) is coupled to match line 305. Although only two ternary CAM cells 300A–300B are shown in FIG. 4, it is understood that additional ternary CAM cells can be coupled to match line 305 in the same manner.

Figure 5:
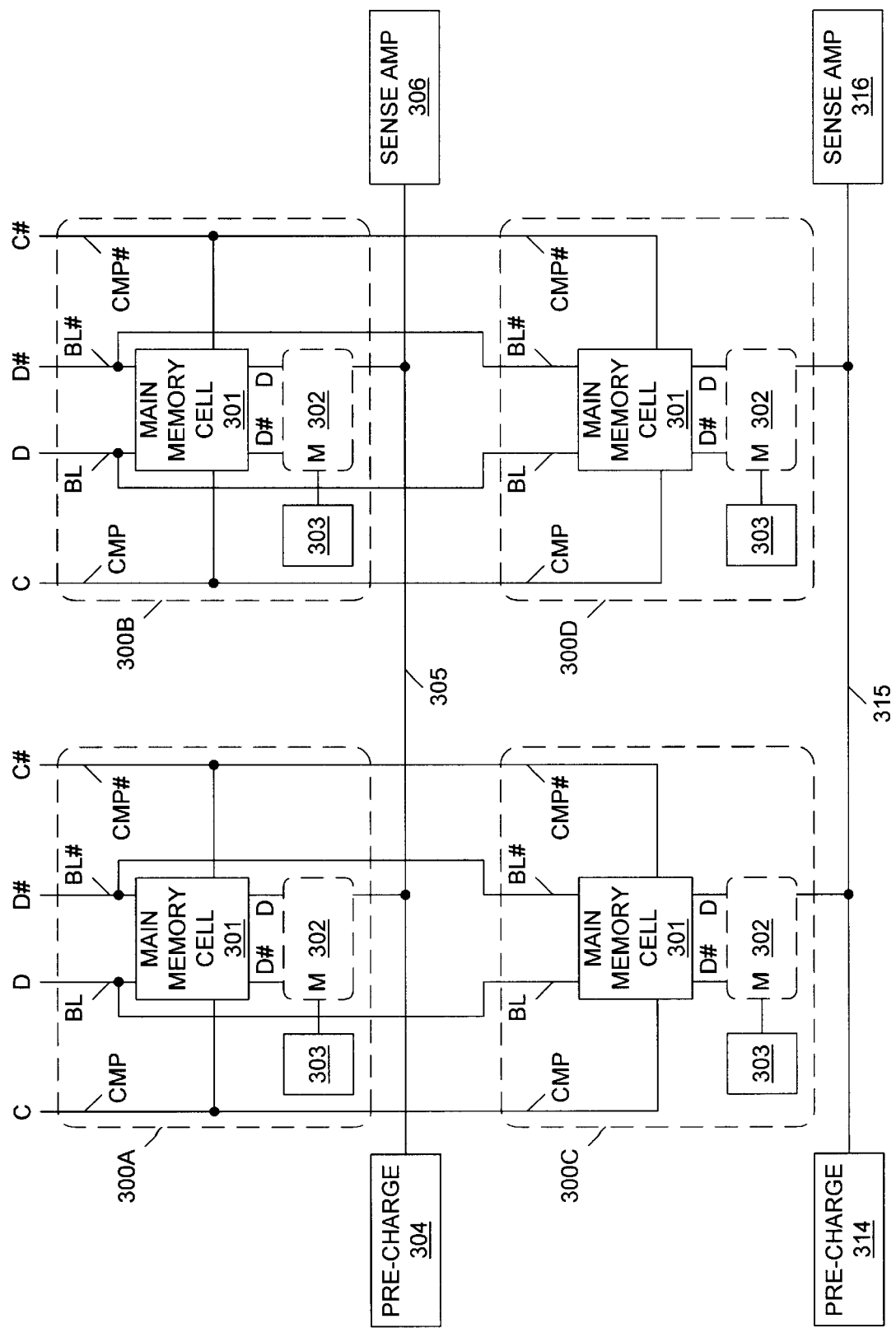

It is also understood that multiple rows of ternary CAM cells can be coupled to form a ternary CAM array in accordance with another embodiment of the present invention. FIG. 5 is a circuit diagram of a 2×2 ternary CAM array 500, which includes the circuitry of FIG. 4, plus a second row of ternary CAM cells 300C and 300D (which are identical to ternary CAM cells 300A and 300B), a second pre-charge circuit 314 (which is identical to pre-charge circuit 304), a second match line 315 (which is identical to match line 305) and a second sense amplifier 316 (which is identical to sense amplifier 306). Ternary CAM cells in the same column, such as ternary CAM cells 300A and 300C, share the same compare lines and bit lines.

Figure 6:
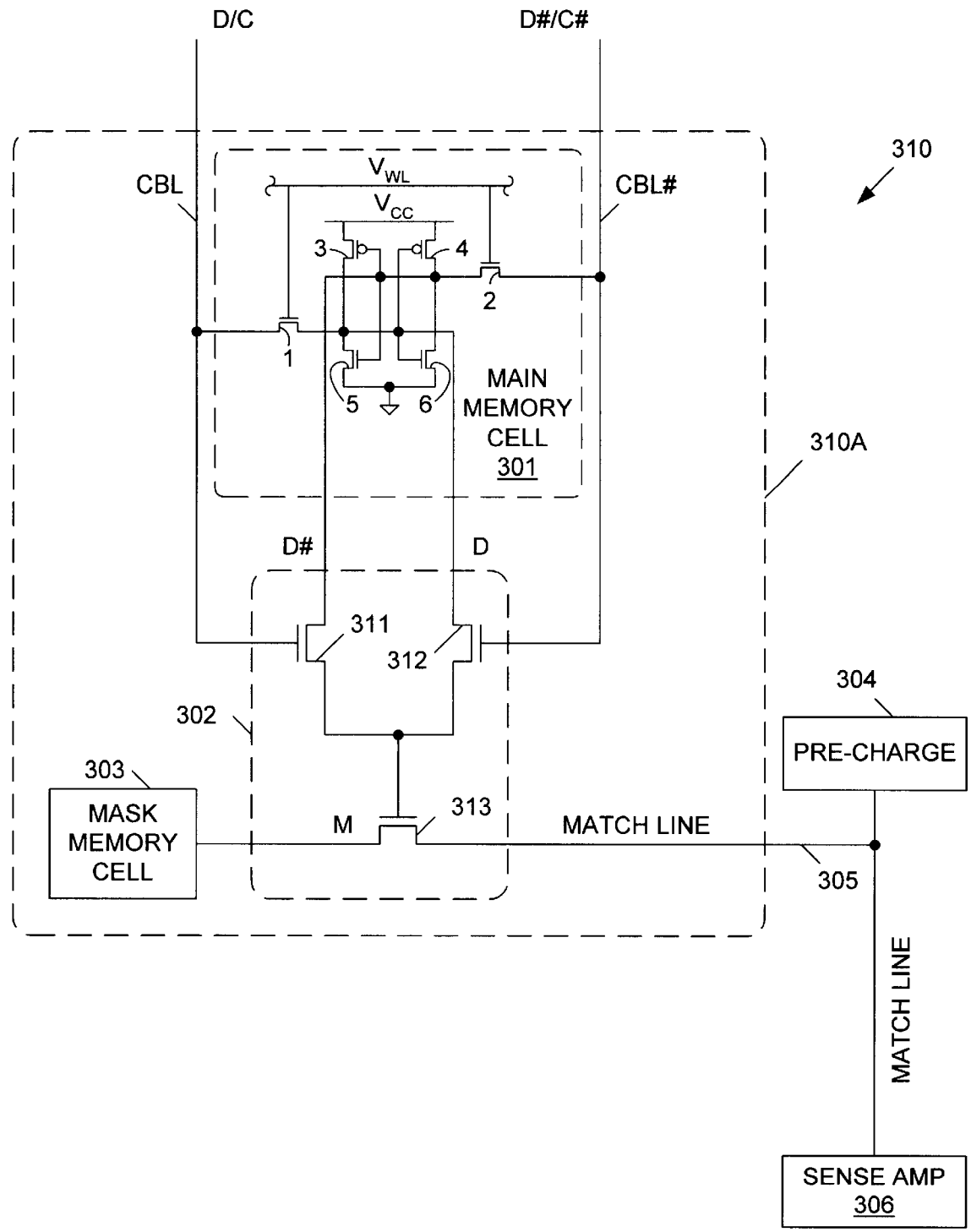
FIG. 6 is a circuit diagram of a ternary CAM system, which is a variation of the ternary CAM system of FIGS. 3–5.

In an alternate embodiment, the bit lines BL and BL# and compare lines CMP and CMP# of ternary CAM system 300 can be consolidated into a single pair of compare/bit lines. FIG. 6 is a circuit diagram of a ternary CAM system 310 which consolidates bit lines BL/BL# and compare lines CMP/CMP# of ternary CAM system 300 into a single pair of compare/bit lines CBL/CBL#, thereby creating a single port ternary CAM cell 310A. Ternary CAM system 310 operates in substantially the same manner as ternary CAM system 300. Ternary CAM system 310 can be arranged in rows and columns in substantially the same manner illustrated in FIGS. 4 and 5.

Figure 7:
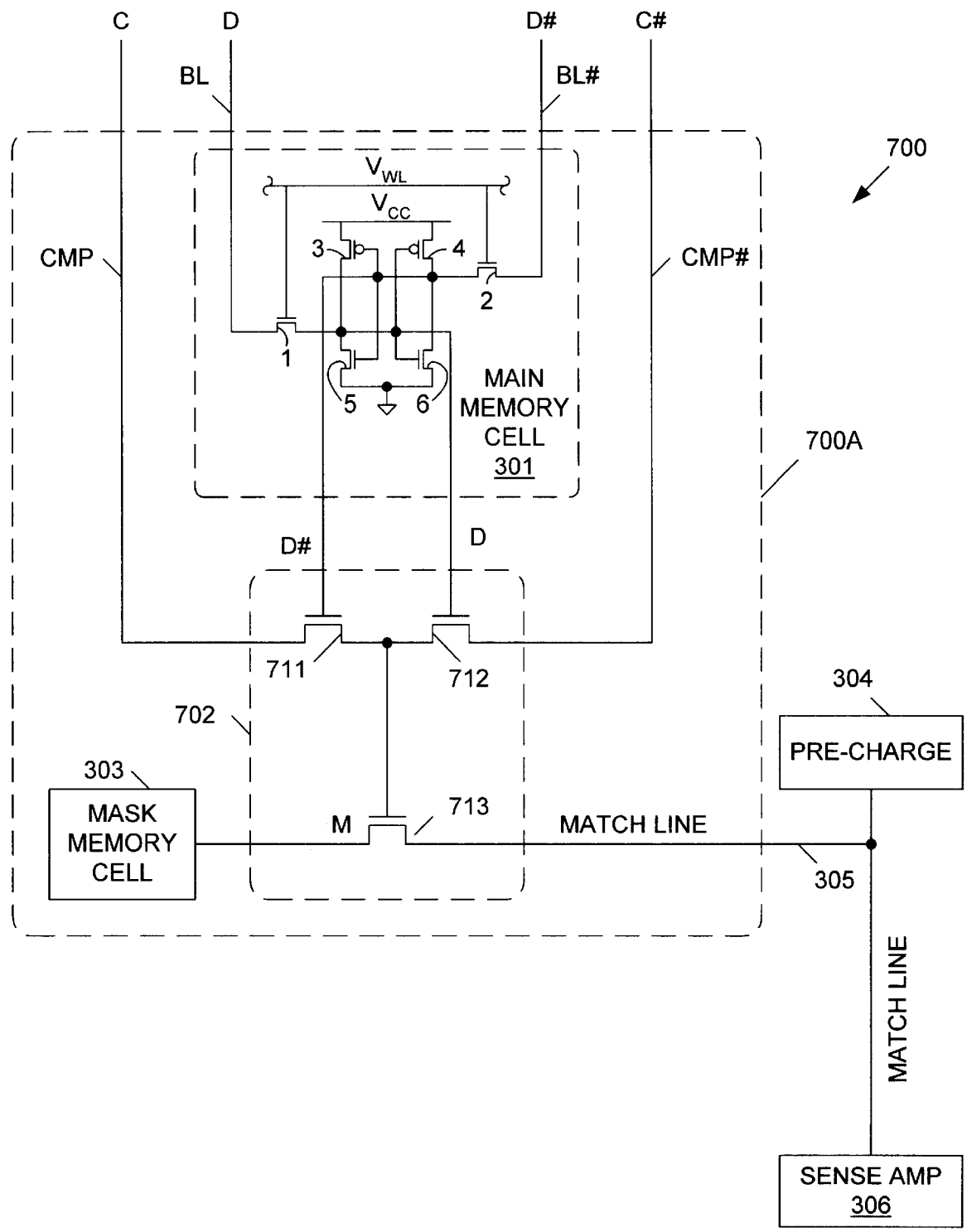
FIG. 7 is a circuit diagram of a ternary CAM system in accordance with another embodiment of the present invention.

FIG. 7 is a circuit diagram of a ternary CAM system 700 in accordance with another embodiment of the present invention. Because ternary CAM system 700 is similar to ternary CAM system 300, similar elements in FIGS. 7 and 3 are labeled with similar reference numbers. Thus, ternary CAM system 700 includes main memory cell 301, mask memory cell 303, pre-charge circuit 304, match line 305 and sense amplifier 306. These elements of ternary CAM system 700 operate in the manner described above for ternary CAM system 300. In addition, ternary CAM system 700 includes compare mask circuit 702. Note that ternary CAM cell 700A includes main memory cell 301, compare/mask circuit 702, and mask memory cell 303.

Compare/mask circuit 702 includes n-channel transistors 711–713, which are connected as illustrated. The complementary data signals D# and D stored in main memory cell 301 are applied to the gates of transistors 711 and 712, respectively, of compare/mask circuit 702. The sources of transistors 711 and 712 are coupled to receive complementary compare data values C and C#, respectively, on complementary compare lines CMP and CMP#, respectively. The drains of transistors 711 and 712 are coupled to the gate of transistor 713. The source of transistor 713 is coupled to receive the mask value (M) from mask memory cell 303. The drain of transistor 713 is coupled to match line 305.

As described in more detail below, compare/mask circuit 702 performs the functions of both a "compare circuit" and a "mask circuit". To accomplish this, transistor 713 simultaneously performs a dual role of comparing and masking. As a result, the number of transistors required to implement a mask circuit can be reduced by one or more. Consequently, ternary CAM system 700 can be implemented using a more compact design than the prior art. Also, as described in more detail below, a compare operation in ternary CAM system 700 advantageously does not result in a disturb condition for the data stored in main memory cell 301. In addition, ternary CAM system 700 allows for two different pre-charge states (high or low) on match line 305, thereby providing flexibility to circuit designers.

The mask value M is programmed into mask memory cell 303 of ternary CAM system 700 to activate and de-activate the mask function in the same manner described above for ternary CAM system 300.

In a first example, a compare operation is performed in ternary CAM cell system 700 as follows. Pre-charge circuit 304 pre-charges match line 305 to the predetermined voltage level. In the present example, it is assumed that pre-charge circuit 304 is configured to apply a positive voltage to match line 305, thereby charging match line 305 to a logic high state. Pre-charge circuit 304 then allows match line 305 to float.

In the present example, mask memory cell 303 is programmed to store a logic low mask value M, such that the masking function is de-activated. A compare value comprised of complementary compare data signals C and C# is applied to complementary compare lines CMP and CMP#, respectively, and thereby to the sources of transistors 711 and 712, respectively. One of the complementary data signals D and D# has a logic high value, which turns on the corresponding one of transistors 712 and 711.

If the compare value matches the data value previously written to main memory cell 301, then the turned on one of transistors 711–712 passes a logic low value to the gate of transistor 713. For example, if the data value D/D# is equal to "1"/"0", and the compare value C/C# is also equal to "1"/"0", then the logic "1" D signal turns on transistor 712, thereby passing the logic "0" C# signal to the gate of transistor 713. Conversely, if the data value D/D# is equal to "0"/"1", and the compare value C/C# is also equal to "0"/"1", then the logic "1" D# signal turns on transistor 711, thereby passing the logic "0" C signal to the gate of transistor 713. In either case, the logic low signal applied to the gate of transistor 713 causes this transistor 713 to turn off, thereby isolating mask memory cell 303 from match line 305. Under these conditions, match line 305 remains charged to a logic high state. Sense amplifier 306, which is coupled to match line 305, detects the high state of match line 305 and in response, identifies the presence of a match condition.

If the compare value does not match the data value previously written to main memory cell 301, then the turned on one of transistors 711–712 passes a logic high value to the gate of transistor 713. For example, if the data value D/D# is equal to "0"/"1", and the compare value C/C# is equal to "1"/"0", then the logic "1" D# signal turns on transistor 711, thereby passing the logic "1" C signal to the gate of transistor 713. Conversely, if the data value D/D# is equal to "1"/"0", and the compare value C/C# is equal to "0"/"1", then the logic "1" D signal turns on transistor 712, thereby passing the logic "1" C# signal to the gate of transistor 713. In either case, the logic high voltage applied to the gate of transistor 713 causes this transistor 713 to turn on, thereby coupling mask memory cell 303 to match line 305. At this time, the logic low mask value M is applied to match line 305, thereby pulling down the voltage on match line 305 to a logic low value. Sense amplifier 306 detects the low state of match line 305 and in response, identifies the presence of a no-match condition. Note that the current flowing through transistor 713 does not flow through main memory cell 301, such that the programmed state of main memory cell 301 is not disturbed.

In the present example, if mask memory cell 303 is programmed such that the mask value M has a logic high value, then the masking function is activated. Under these conditions, it does not matter whether the compare data value matches the previously stored data value, the match line 305 will remain at a logic high state during a compare operation. Thus, if the compare data value matches the previously stored data value, then transistor 713 remains off, thereby isolating match line 305 from mask memory cell 303, such that match line 305 remains charged high. Similarly, if the compare data value does not match the previously stored data value, then transistor 713 turns on, thereby coupling match line 305 to the logic high mask value M stored in mask memory cell 303, such that match line 305 remains charged high.

Alternately, ternary CAM system 700 can be configured in the following manner to perform a compare operation in accordance with a second example. Pre-charge circuit 304 is configured to pre-charge match line 305 to a logic low level (e.g., ground). Pre-charge circuit 304 then allows match line 305 to float.

In the present example, mask memory cell 303 is programmed to store a logic high mask value M, such that the masking function is de-activated. A compare value comprised of complementary compare data signals C and C# is applied to complementary compare lines CMP and CMP#, respectively, and thereby to the sources of transistors 711 and 712, respectively. One of the complementary data signals D# and D has a logic high value, which turns on the corresponding one of transistors 711–712.

If the compare value matches the data value previously written to main memory cell 301, then the turned on one of transistors 711–712 passes a logic low value to the gate of transistor 713. As a result, transistor 713 is turned off, thereby isolating mask memory cell 303 from match line 305. Under these conditions, match line 305 remains at a logic low state.

If the compare value does not match the data value previously written to main memory cell 301, then the turned on one of transistors 711 or 712 passes a logic high value to the gate of transistor 713. As a result, transistor 713 turns on, thereby coupling mask memory cell 303 to match line 305. At this time, the logic high mask value M is applied to match line 305, thereby pulling up the voltage on match line 305 to a logic high value. Sense amplifier 306 detects the high state of the match line 305, and in response, identifies the presence of a no-match condition.

If mask memory cell 303 is programmed to store a logic low mask value M, then the masking function is activated. Under these conditions, it does not matter whether the compare data value matches the previously stored data value, the match line 305 will remain at a logic low state during a compare operation. Thus, if the compare data value matches the data value previously stored in main memory cell 301, then transistor 713 remains off, thereby isolating match line 305 from mask memory cell 303, such that match line 305 remains at a logic low state. If the compare data value does not match the data value previously stored in main memory cell 301, then transistor 713 turns on, thereby coupling match line 305 to receive the logic low mask value M stored in mask memory cell 303, such that match line 305 remains charged low.

Table 2 below summarizes the possible compare operations in ternary CAM system 700.

TABLE 2

| Pre-charge Level | Mask Value | D/D# = C/C# | Match Line |
|---|---|---|---|
| High | Low | Yes | High |
| High | Low | No | Low |
| High | High | Yes | High |
| High | High | No | High |
| Low | High | Yes | Low |
| Low | High | No | High |
| Low | Low | Yes | Low |
| Low | Low | No | Low |

Additional ternary CAM cells, identical to ternary CAM cell 700A, can be coupled to match line 305, thereby forming a row of a ternary CAM array, in the same manner described in connection with FIG. 4. It is also understood that multiple rows of ternary CAM cells can be coupled to form a ternary CAM array in accordance with another embodiment of the present invention, in the same manner described in connection with FIG. 5.

Figure 8:
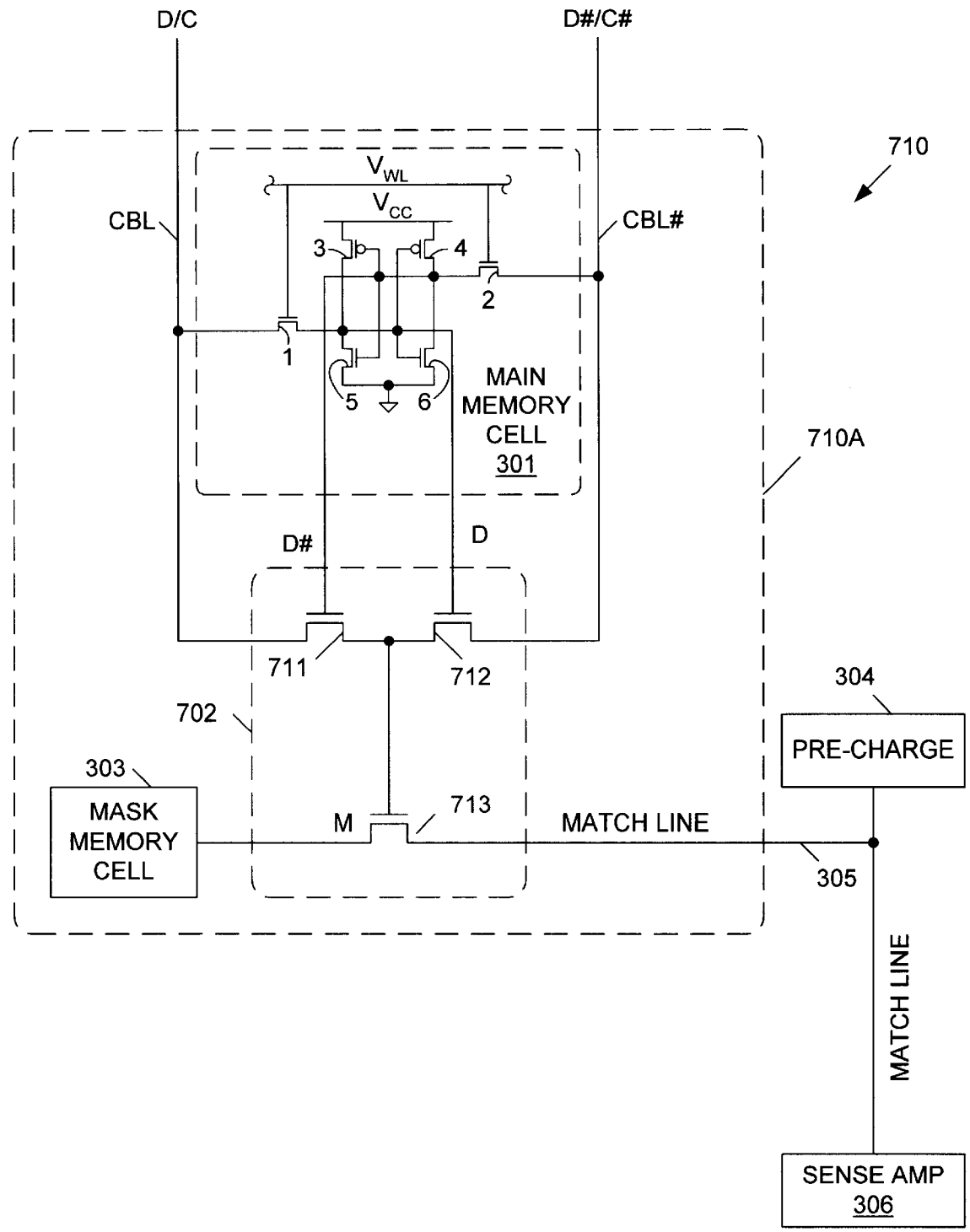
FIG. 8 is a circuit diagram of a ternary CAM system, which is a variation of the ternary CAM system of FIG. 7.

In an alternate embodiment, the bit lines BL and BL# and compare lines CMP and CMP# of ternary CAM system 700 can be consolidated into a single pair of compare/bit lines. FIG. 8 is a circuit diagram of a ternary CAM system 710 which consolidates bit lines BL/BL# and compare lines CMP/CMP# of ternary CAM system 700 into a single pair of compare/bit lines CBL/CBL#, thereby creating a single port ternary CAM cell 710A. Ternary CAM system 710 operates in substantially the same manner as ternary CAM system 700. Ternary CAM system 710 can be arranged in rows and columns in substantially the same manner illustrated in FIGS. 4 and 5.

Although the invention has been described in connection with several embodiments, it is understood that this invention is not limited to the embodiments disclosed, but is capable of various modifications, which would be apparent to a person skilled in the art. Thus, the invention is limited only by the following claims.

What is claimed is:

1. A ternary content addressable memory (TCAM) system comprising:
    a main memory cell configured to store a data value represented by complementary data signals D and D#;
    a first transistor having a first source/drain region coupled to receive the data signal D# from the main memory cell, and a gate coupled to receive a compare data signal C;
    a second transistor having a first source/drain region coupled to receive the data signal D from the main memory cell and a gate coupled to receive a compare data signal C#, wherein the compare data signals C and C# are complementary signals representing a compare value;
    a third transistor having a gate coupled to second source/drain regions of the first and second transistors;
    a mask memory cell coupled to a first source/drain region of the third transistor;
    a pre-charge circuit coupled to a second source/drain region of the third transistor; and
    a match line coupled to the second source/drain region of the third transistor.

2. The TCAM system of claim 1, wherein the main memory cell is a static random access memory (SRAM) cell.

3. The TCAM system of claim 1, wherein the first, second and third transistors are n-channel transistors.

4. The TCAM system of claim 1, further comprising a sense amplifier coupled to the match line.

5. The TCAM system of claim 1, further comprising a first pair of bit lines configured to route the data signals D and D# to the main memory cell.

6. The TCAM system of claim 5, further comprising a second pair of bit lines configured to route the compare data signals C and C# to the gates of the first and second transistors, respectively.

7. The TCAM system of claim 5, wherein the first pair of bit lines are configured to route the compare data signals C and C# to the gates of the first and second transistors, respectively.

8. A ternary content addressable memory (TCAM) system comprising:
    a match line;
    a pre-charge circuit coupled to the match line;
    a sense amplifier coupled to the match line; and
    a plurality of TCAM cells, each being coupled to the match line, wherein each of the TCAM cells comprises:
        a main memory cell configured to store a data value represented by complementary data signals D and D#;
        a first transistor having a first source/drain region coupled to receive the data signal D# from the main memory cell, and a gate coupled to receive a compare data signal C;
        a second transistor having a first source/drain region coupled to receive the data signal D from the main memory cell and a gate coupled to receive a compare data signal C#, wherein the compare data signals C and C# are complementary signals representing a compare value;
        a third transistor having a gate coupled to second source/drain regions of the first and second transistors, and a first source/drain region coupled to the pre-charge circuit through the match line; and
        a mask memory cell coupled to a second source/drain region of the third transistor.

9. A method of implementing a ternary content addressable memory (TCAM) comprising:
    storing a data value in a main memory cell;
    storing a mask value in a mask memory cell;
    pre-charging a match line;
    applying the data value to a compare/mask circuit;
    applying the mask value to the compare/mask circuit;
    applying a compare value to the compare/mask circuit;
    isolating the mask memory cell from the match line with the compare/mask circuit if the compare value matches the data value; and
    coupling the mask memory cell to the match line with the compare/mask circuit if the compare value does not match the data value.

10. The method of claim 9, further comprising sensing a charge of the match line to determine whether a match or no-match condition exists.

11. The method of claim 9, further comprising pre-charging the match line to the same state as the mask value to perform a masking function.

12. The method of claim 11, wherein the state is a logic high state.

13. The method of claim 12, wherein the state is a logic low state.

14. The method of claim 9, wherein the data value is represented by complementary data signals D and D#, and the compare value is represented by complementary compare signals C and C#, the method further comprising:
    applying the data signal D# to the source of a first transistor in the compare/mask circuit;
    applying the data signal D to the source of a second transistor in the compare/mask circuit;
    applying the compare data signal C to a gate of the first transistor;
    applying a compare data signal C# to a gate of the second transistor, whereby one of the first and second transistors is turned on by the compare value.

15. The method of claim 14, further comprising routing either the data signal D through the second transistor, or the data signal D# through the first transistor, to the gate of a third transistor in the compare/mask circuit in response to the compare value.

16. The method of claim 15, further comprising:
    turning on the third transistor to couple the mask memory cell to the match line when the data value does not match the compare value; and
    turning off the third transistor to isolate the mask memory cell from the match line when the data value matches the compare value.

17. A ternary content addressable memory (TCAM) system comprising:
    a main memory cell configured to store a data value represented by complementary data signals D and D#;
    a first transistor having a gate coupled to receive the data signal D# from the main memory cell, and a first source/drain region coupled to receive a compare data signal C;

a second transistor having a gate coupled to receive the data signal D from the main memory cell and a first source/drain region coupled to receive a compare data signal C#, wherein the compare data signals C and C# are complementary signals representing a compare value;

a third transistor having a gate coupled to second source/drain regions of the first and second transistors;

a mask memory cell coupled to a first source/drain region of the third transistor;

a pre-charge circuit coupled to a second source/drain region of the third transistor; and a match line coupled to the second source/drain region of the third transistor.

18. The TCAM system of claim 17, wherein the main memory cell is a static random access memory (SRAM) cell.

19. The TCAM system of claim 17, wherein the first, second and third transistors are n-channel transistors.

20. The TCAM system of claim 17, further comprising a sense amplifier coupled to the match line.

21. The TCAM system of claim 17 further comprising a first pair of bit lines configured to route the data signals D and D# to the main memory cell.

22. The TCAM system of claim 21, further comprising a second pair of bit lines configured to route the compare data signals C and C# to the first source/drain regions of the first and second transistors, respectively.

23. The TCAM system of claim 21, wherein the first pair of bit lines are configured to route the compare data signals C and C# to the first source/drain regions of the first and second transistors, respectively.

24. A ternary content addressable memory (TCAM) system comprising:

a match line;

a pre-charge circuit coupled to the match line;

a sense amplifier coupled to the match line; and a plurality of TCAM cells, each being coupled to the match line, wherein each of the TCAM cells comprises:

a main memory cell configured to store a data value represented by complementary data signals D and D#;

a first transistor having a gate coupled to receive the data signal D# from the main memory cell, and a first source/drain region coupled to receive a compare data signal C;

a second transistor having a gate coupled to receive the data signal D from the main memory cell and a first source/drain region coupled to receive a compare data signal C#, wherein the compare data signals C and C# are complementary signals representing a compare value;

a third transistor having a gate coupled to second source/drain regions of the first and second transistors, and a first source/drain region coupled to the pre-charge circuit through the match line; and a mask memory cell coupled to a second source/drain region of the third transistor.

25. A method of implementing a ternary content addressable memory (TCAM) comprising:

storing a data value represented by complementary data signals D and D# in a main memory cell;

storing a mask value in a mask memory cell;

pre-charging a match line;

applying the data signal D# to a gate of a first transistor and applying the data signal D to a gate of a second transistor, whereby one of the first and second transistors is turned on by the data value;

applying a compare data signal C to a source of the first transistor;

applying a compare data signal C# to a source of the second transistor;

routing either the compare data signal C# through the second transistor, or the compare data signal C through the first transistor, to the gate of a third transistor in response to the data value;

turning on the third transistor to couple the mask memory cell to the match line when the data value does not match the compare value; and turning off the third transistor to isolate the mask memory cell from the match line when the data value matches the compare value.

* * * * *